United States Patent
Lin et al.

(10) Patent No.: US 7,740,446 B2
(45) Date of Patent: *Jun. 22, 2010

(54) SERIAL FAN WITH A PLURALITY OF ROTOR VANES

(75) Inventors: Kuo-cheng Lin, Taoyuan (TW);
Wen-shi Huang, Taoyuan (TW);
Shun-chen Chang, Taipei (TW); Pohao Yu, Taoyuan (TW)

(73) Assignee: Delta Electronics, Inc., Taoyuan County (TW)

( * ) Notice: Subject to any disclaimer, the term of this patent is extended or adjusted under 35 U.S.C. 154(b) by 335 days.

This patent is subject to a terminal disclaimer.

(21) Appl. No.: 11/672,780

(22) Filed: Feb. 8, 2007

(65) Prior Publication Data

US 2007/0128023 A1 Jun. 7, 2007

Related U.S. Application Data

(63) Continuation of application No. 10/412,226, filed on Apr. 14, 2003, now Pat. No. 7,238,004, which is a continuation-in-part of application No. 09/484,497, filed on Jan. 18, 2000, now Pat. No. 6,652,230.

(30) Foreign Application Priority Data

Nov. 25, 1999 (TW) ............................... 88220261 U

(51) Int. Cl.
*F04D 29/44* (2006.01)
*F01D 1/00* (2006.01)
(52) U.S. Cl. ................................. 415/199.4; 415/182.1

(58) Field of Classification Search .............. 415/199.4, 415/198.1, 199.5, 219.1, 220, 182.1, 191
See application file for complete search history.

(56) References Cited

U.S. PATENT DOCUMENTS

| | | | |
|---|---|---|---|
| 1,365,871 A | 1/1921 | Thiesen |
| 1,985,022 A | 12/1934 | De Bothezat |
| 2,121,073 A | 6/1938 | De Bothezat |
| 2,313,413 A | 3/1943 | Weske |
| 3,038,307 A | 6/1962 | Oprecht |
| 3,088,414 A | 5/1963 | Ozgur |
| 3,127,093 A | 3/1964 | Sudrow |
| 3,187,189 A | 6/1965 | Lang |
| 3,270,820 A | 9/1966 | Frazier |
| 3,291,381 A | 12/1966 | Troller |
| 3,574,477 A | 4/1971 | Dolf |
| 3,651,622 A | 3/1972 | Wisting |
| 3,804,335 A | 4/1974 | Sohre |

(Continued)

FOREIGN PATENT DOCUMENTS

JP 55-094000 A 7/1980

(Continued)

*Primary Examiner*—John T Kwon
(74) *Attorney, Agent, or Firm*—Muncy, Geissler, Olds & Lowe, PLLC

(57) ABSTRACT

A serial fan includes a frame, a plurality of rotor vanes, a support connected to the frame through a plurality of connecting parts. The plurality of rotor vanes are arranged in series in the frame along an axial direction and the plurality of connecting parts are disposed therebetween to minimize space occupied by the serial fan in the axial direction, and effectively increase the blast pressure.

19 Claims, 6 Drawing Sheets

U.S. PATENT DOCUMENTS

| | | | |
|---|---|---|---|
| 4,182,118 A | 1/1980 | Chronic | |
| 4,219,307 A | 8/1980 | Bergdahl et al. | |
| 4,336,748 A | 6/1982 | Martin et al. | |
| 4,453,816 A | 6/1984 | Hiraike et al. | |
| 4,548,548 A | 10/1985 | Gray, III | |
| 4,563,126 A | 1/1986 | Kobayashi et al. | |
| 5,230,719 A | 7/1993 | Berner et al. | |
| 5,258,676 A | 11/1993 | Reinhardt et al. | |
| 5,546,272 A | 8/1996 | Moss et al. | |
| 5,720,661 A | 2/1998 | Yoshizawa et al. | |
| 5,758,716 A | 6/1998 | Shibata et al. | |
| 5,771,961 A | 6/1998 | Alizadeh | |
| 5,820,345 A | 10/1998 | Giffin, III et al. | |
| 5,931,640 A | 8/1999 | Van Houten et al. | |
| 5,944,497 A | 8/1999 | Kershaw et al. | |
| 5,984,631 A | 11/1999 | Tolgos | |
| 6,045,327 A | 4/2000 | Amr | |
| 6,099,249 A | 8/2000 | Hashimoto et al. | |
| 6,152,382 A | 11/2000 | Pun | |
| 6,244,818 B1 | 6/2001 | Chang et al. | |
| 6,386,276 B1 | 5/2002 | Chen et al. | |
| 6,565,334 B1 | 5/2003 | Bradbury et al. | |
| 6,612,817 B2 | 9/2003 | Lin et al. | |
| 6,626,653 B2 | 9/2003 | Lin et al. | |
| 6,652,230 B1 | 11/2003 | Huang et al. | |
| 6,663,342 B2 | 12/2003 | Huang et al. | |

FOREIGN PATENT DOCUMENTS

| | | | |
|---|---|---|---|
| JP | 59-203897 A | 11/1984 | |
| JP | 61-004895 A | 1/1986 | |
| JP | 02-264200 A | 10/1990 | |

SERIAL FAN WITH A PLURALITY OF ROTOR VANES

This application is a continuation of application Ser. No. 10/412,226 filed Apr. 14, 2003 now U.S. Pat. No. 7,238,004 which is a continuation-in-part application of the application bearing Ser. No. 09/484,497 and filed on Jan. 18, 2000 now U.S. Pat. No. 6,652,230 which is based on, and claims priority from, Taiwan Application Serial Number 88220261, filed on Nov. 25, 1999, the disclosure of which is hereby incorporated by reference herein in its entirety.

BACKGROUND OF THE INVENTION

1. Field of the Invention

The invention relates to a serial fan and, more particularly, to an axial-flow serial fan that has a plurality of rotor vanes in series and a plurality of air-guiding blades between the plurality of rotor vanes.

2. Description of the Related Art

The axial-flow fan is a popular fan device that has the features such as a simple structure, low costs, and a high airflow rate. These features have made it widely used in various systems as an air conditioning or ventilating device, for example, as the ventilation fan in a computer system.

In general, since the total pressure of the axial-flow fan is lower, the axial-flow fan cannot fully develop a high flow rate in a system of a high resistance. Therefore, in the case that a high total pressure is needed, two or more axial-flow fans are conventionally employed in series to provide the high total pressure.

Moreover, to avoid the interruption of operation due to the breakdown of the fans, a set of standby fan system is usually assembled together to the original fan system to avoid the system or device damage due to the interruption of the fan operation.

However, connecting two fans in series does not double the total pressure. Even if only one fan operates and the other stays still as a standby fan, the latter one reduces the total pressure of the fan in operation. The reason is that when the two fans are assembled together, the resistance between them increases and the operation efficiencies of them is decreased. Thus, in certain situations, for example, in an air duct of an air conditioning system, the two axial-flow fans in series are separated far apart to minimize the interference between them. Nevertheless, this method is not feasible in the case that the installation space is limited.

Therefore, it is an important subject to design an axial-flow serial fan with a plurality of rotor vanes that requires a small space and has the least interference effect.

SUMMARY OF THE INVENTION

In view of the foregoing problems, an object of this invention is to provide an axial-flow serial fan with a plurality of rotor vanes, which reduces the air flow interference between the rotor vanes so that the total pressure of the serial fan with a plurality of rotor vanes can be increased.

Another object of the invention is to provide an axial-flow serial fan with a plurality of rotor vanes that occupies less space in its axial direction.

To achieve the above objects, an axial-flow serial fan includes a frame, a plurality of rotor vanes, a support connected to the frame through a plurality of connecting parts, wherein the plurality of rotor vanes are arranged in series in the frame along an axial direction to minimize space occupied by the axial-flow serial fan in the axial direction.

According to the invention, since the plurality of rotor vanes are installed within a frame and the space between any two adjacent rotor vanes is minimized, therefore the volume of the fan in the axial direction can be greatly reduced.

According to the invention, the inner side of the frame is provided with a plurality of connecting parts extending from the inner periphery of the frame to the support disposed in the center of the frame. The plurality of connecting parts can be ribs or air-guiding blades. In addition, the plurality of connecting parts and the frame can be integrally formed together.

BRIEF DESCRIPTION OF THE DRAWINGS

The invention will become more fully understood from the detailed description given hereinbelow, wherein.

DETAILED DESCRIPTION OF THE INVENTION

An axial-flow serial fan in accordance with a preferred embodiment of the invention is hereinafter explained with reference to the accompanying drawings, wherein the same elements are represented by the same numerals.

Figure 1:
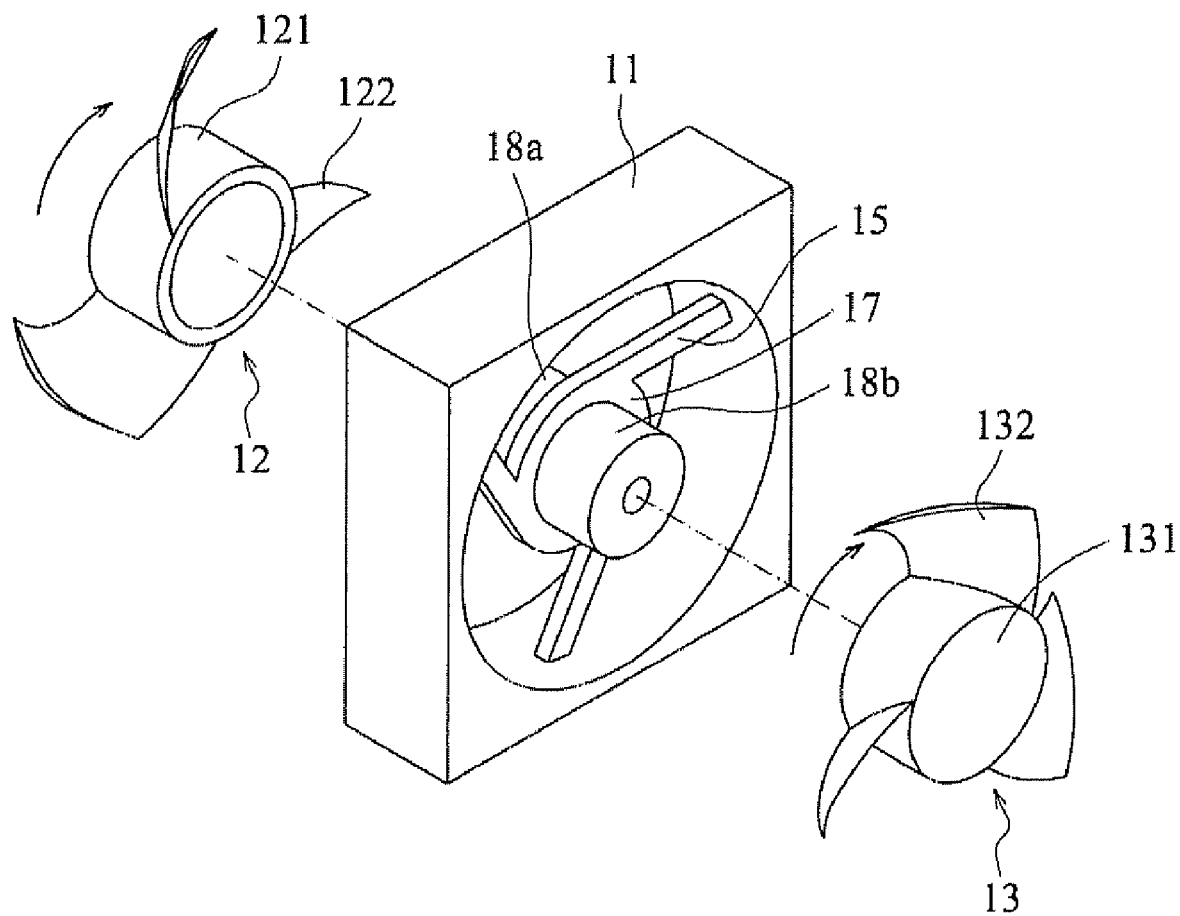
FIG. 1 is a three-dimensional view of an axial-flow serial fan in accordance with a preferred embodiment of the invention.

FIG. 1 is a three-dimensional view of an axial-flow serial fan 10 in accordance with a preferred embodiment of the invention. The axial-flow serial fan 10 includes a frame 11, a first rotor vane 12, and a second rotor vane 13. The first rotor vane 12 is installed on an inlet side of the axial-flow serial fan 10 and contains a first hub 121 and three first blades 122. The second rotor vane 13 is installed on an outlet side of the axial-flow serial fan 10 and contains a second hub 131 and three second blades 132. The first rotor vane 12 and the second rotor vane 13 are arranged in series in the frame along an axial direction. A support 17 is provided inside the frame 11 and a plurality of ribs 15 are connected between the support 17 and the frame 11. A first motor 18a is provided on the inlet side of the support 17 and within the first hub 121 for driving the first rotor vane 12; and a second motor 18b is provided on the outlet side of the support 17 and within the second hub 131 for driving the second rotor vane 13.

Figure 2:
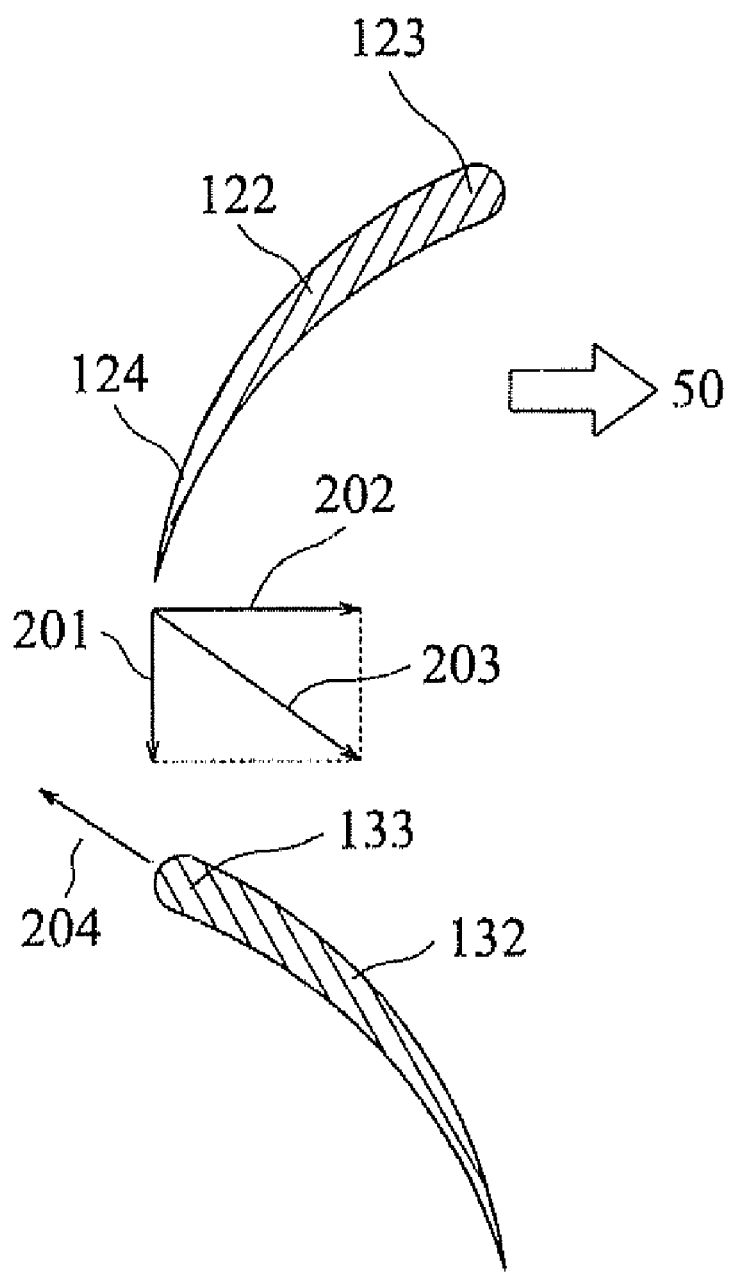
FIG. 2 is a schematic view of the relative rotation relation between the first and second blades in the axial-flow serial fan in accordance with the preferred embodiment of the invention.

FIG. 2 is a schematic view of the relative rotation relation between the first blade 122 of the first rotor vane 12 and the second blade 132 of the second rotor vane 13. The symbols 123 and 124 represent the inlet and outlet sides of the first blade 122, respectively. The symbol 133 is the inlet side of the second blade 132. Referring to FIG. 2, if the second rotor vane 13 is set as a standby rotor vane, only the first rotor vane 12 is rotating and the second rotor vane 13 stays still when the fan 10 is in normal operation. At this moment, if the first blade 122 rotates in the direction indicated by an arrow 50, then air flows out of the outlet side 124 of the first blade 122 along its shape after shearing by the inlet side of the first blade 122. In FIG. 2, the vector 201 indicates the magnitude and direction of the air flow velocity relative to the outlet side 124 of the first blade 122. However, due to the rotation of the first blade 122 itself, the air flow velocity from the outlet side 124 of the first blade 122 relative to the second blade 132 equals to the sum of the velocity vector 202 of the outlet side 124 of the first blade 122 and the vector 201. A vector 204 indicates the extension direction of the inlet side 133 of the second blade 132. Obviously, if the air flow vector 203 out of the first blade 122 is parallel to the vector 204, then the air flow experiences the least resistance and the interference between the rotor vanes is also minimized. In fact, the standby second blade 132 in this situation has a similar function to that of an air-guiding vane, which does not interfere with the airflow and even corrects the outgoing direction of the airflow so as to increase the flow rate and pressure.

The first rotor vane 12 and the rotor vane 13 can also rotate at the same time. One can design the shapes of the first blade 122 and the second blade 132 according to the rotation and wind speeds needed so that the air flow out of the first blade 122 can be parallel to the extension direction of the inlet side 133 of the second blade 132. In general, it is preferable to have the first rotor vane 12 and the second rotor vane 13 rotate in opposite directions with respect to the orientations of the first blade 122 and the second blade 132 as shown in FIG. 2. Thus, when the first rotor vane 12 and the second rotor vane 13 rotate at the same time, they can guide the airflow and do not lower the pressure without the interference with each other in this serial fan.

In conclusion, the relationship between the first blade 122 and the second blade 132 satisfy the following equation:

$$V^\omega_{air \to 1bo} = V^\omega_{1b \to 2}b = D^\omega_{2bi}$$

wherein $V^\omega_{air \to 1bo}$ is a velocity vector of airflow relative to an outlet side of the first blade 122, $V^\omega_{1b \to 2}b$ is a relative velocity vector of the first blade 122 to that of the second blade 132, and $D^\omega_{2bi}$ is an extension direction vector of an inlet side of the second blade 132.

As a matter of fact, it is possible that even if the shape of the fan is so designed that the outgoing direction of the air flow from the first blade 122 is parallel to the extension direction on the inlet side 133 of the second blade 132, the desirable effects still cannot be achieved in real operation because of the environmental changes or other factors such as design or manufacture errors. Nevertheless, as long as the outgoing direction of the air flow from the first blade 122 is not much different from the extension direction on the inlet side 133 of the second blade 132, the basic feature of this invention can be maintained and the function of flow guidance can be achieved.

Moreover, in this embodiment, it is necessary for the second driving motor 18b to be installed on the support 17. An axis can be connected to the second rotor vane 13 so that the second rotor vane 13 can rotate freely with respect to the support 17. The second rotor vane 13 would not be driven to rotate and only possesses the function of guiding the outlet airflow. Similarly, through the design of the blade shape, the first driving motor 18a can be saved so that the first rotor vane 12 can only have the function of guiding inlet air flow.

Since the two rotor vanes are provided within a frame and the space between the two rotor vanes can be minimized, the axial-flow serial fan of the invention occupies the least space in the axial direction. This feature is very important for systems such as a server or a notebook that requires a fan having a high flow rate or pressure but has a small space for the fan.

Figure 3:
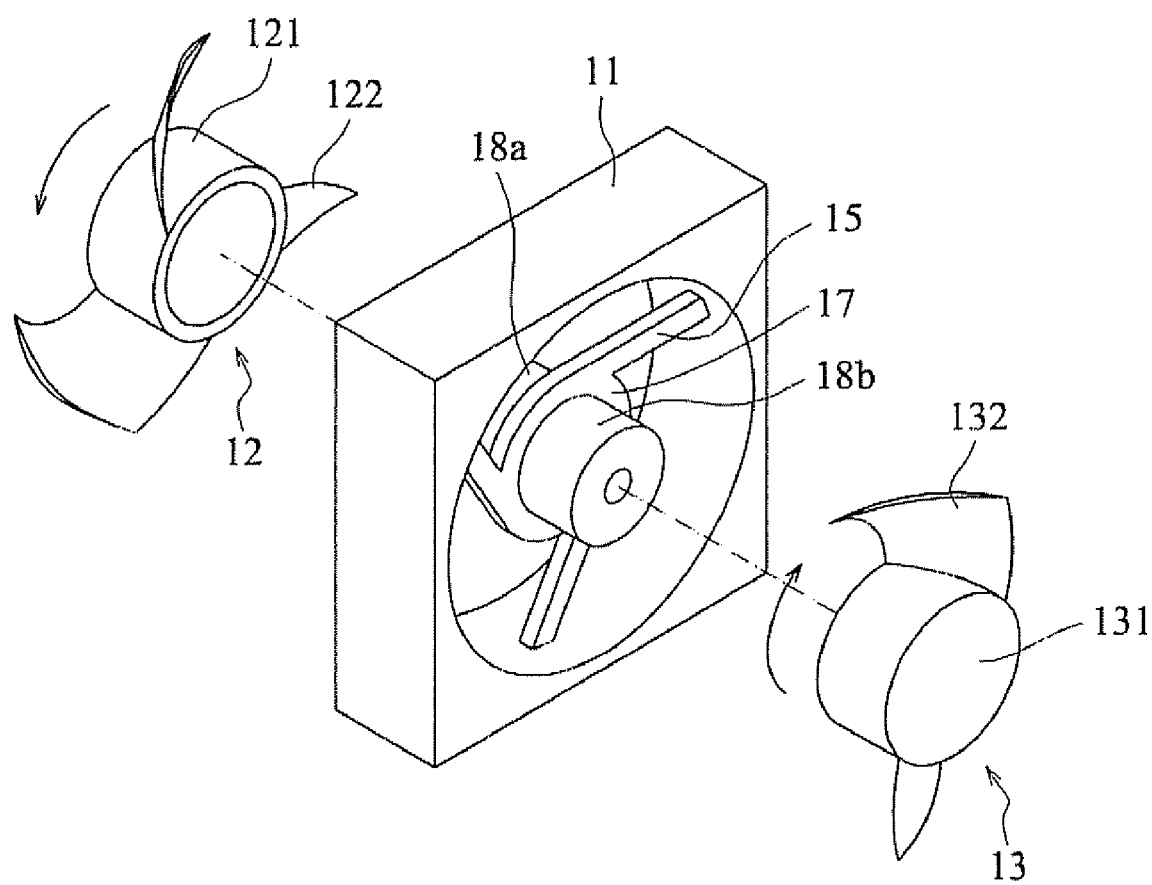
FIG. 3 is a three-dimensional view showing an axial-flow serial fan in accordance with another embodiment of the invention.

The numbers of the first blades 122 and second blades 132 both are three in accordance with the embodiment. However, the numbers of the first blades 122 and second blades 132 may be different, for example, three first blades 122 and two second blades 132 as shown in FIG. 3. Also, the shape of the blades, the tilting angles of the blades, the rotation direction, and the rotation speed can vary. Therefore, by designing different rotation states of both rotor vanes, one can achieve the rotational balance of the fan and can reduce the vibration and noise in rotation. Furthermore, through the design of how both rotor vanes are installed, the two rotor vanes can share a single driving motor to lower the manufacturing cost and the assembling cost.

Aside from the previous embodiment, the invention can be implemented in other ways. For example, three or more rotor vanes can be serially connected to increase the total pressure or air flow rate of the fan. The positions of the rotor vanes are not limited to the opposite sides of the support and can be disposed on the same side if necessary. The inlet and outlet sides of the fan can be provided with ribs and the rotor vanes are protected within the fan frame. The shape of the ribs is not limited to the long-beam shape, and can be any shape that reduces the air flow pressure so as to enhance the efficiency.

Figure 4A:
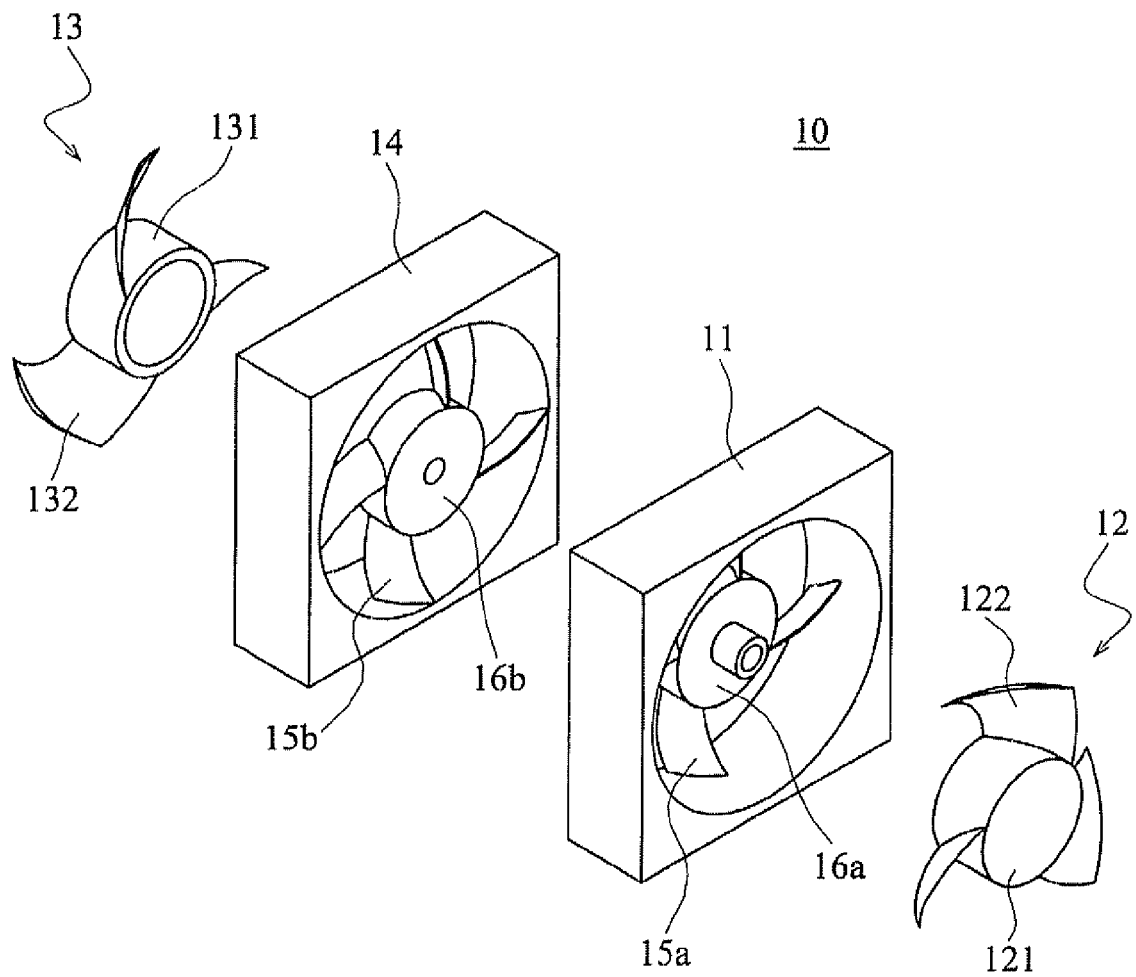
FIG. 4A is a three-dimensional view showing an axial-flow serial fan in accordance with another embodiment of the invention.

For example, the ribs can be replaced by air-guiding blades. FIG. 4A is a three-dimensional view of an axial-flow serial fan 10 in accordance with another embodiment of the invention. The axial-flow serial fan 10 includes a first frame 11, a first rotor vane 12, a second frame 14 and a second rotor vane 13. The first rotor vane 12 is installed on an inlet side of the axial-flow serial fan 10 and contains a first hub 121 and a plurality of first blades 122. The second rotor vane 13 is installed on an outlet side of the axial-flow serial fan 10 and contains a second hub 131 and a plurality of second blades 132. The first frame 11 and the second frame 14 are connected with each other, and thus the first rotor vane 12 and the second rotor vane 13 are arranged in series along an axial direction. A support 16a is provided inside the first frame 11 and connected to the frame 11 through a plurality of air-guiding blades 15a. A support 16b is provided inside the second frame 14 and connected to the frame 14 through a plurality of air-guiding blades 15b. A first motor (not shown) is provided within the first hub 121 for driving the first rotor vane 12; and a second motor (not shown) is provided within the second hub 131 for driving the second rotor vane 13.

Figure 4B:
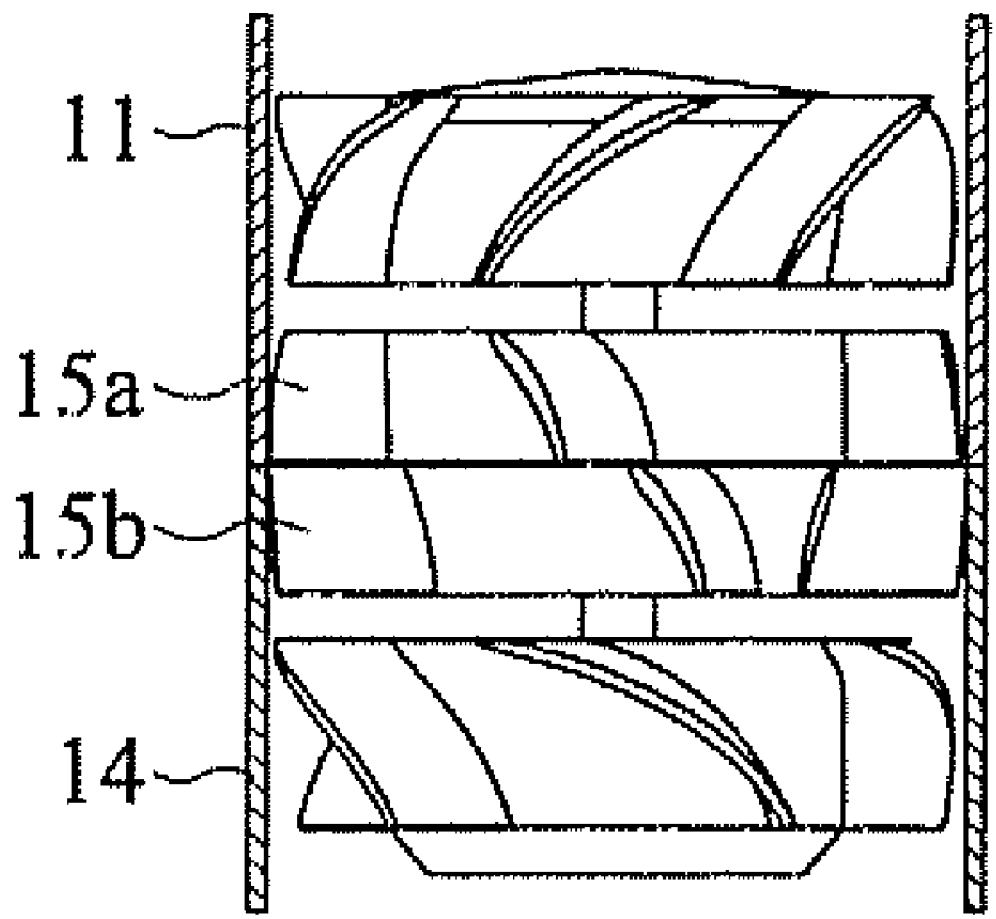
FIG. 4B is a sectional view of FIG. 4A.

As stated above, the first frame 11 and the second frame 14 are connected with each other, and therefore, the first rotor vane 12 and the second rotor vane 13 are arranged in series and the plurality of air-guiding blades 15a and 15b are disposed therebetween in the axial direction. As shown in FIG. 4B, when the first and second frames are combined together, two-layer air-guiding blades disposed inside the whole frame not only can connect the support to the frame but also contribute to increase the blast pressure without any interference.

Figure 5A:
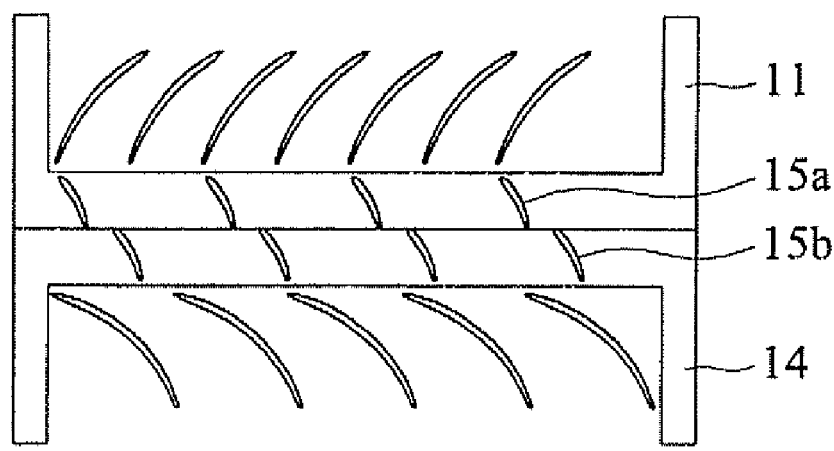
FIGS. 5A to 5C are schematic views showing different configurations of the connecting parts in accordance with the invention.
Figure 5B:
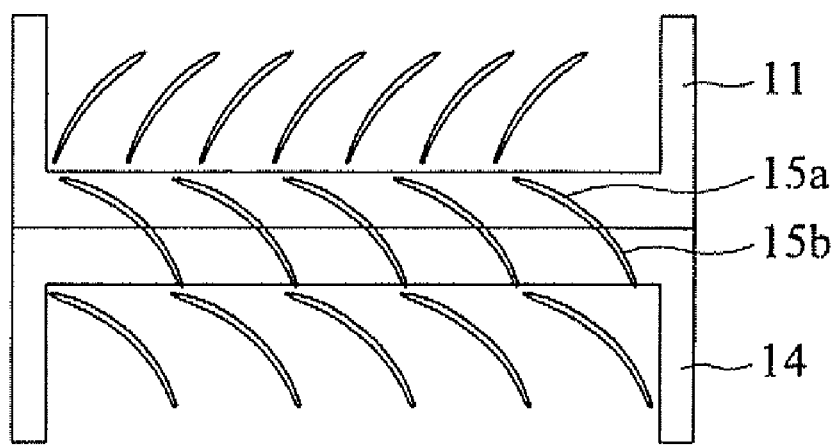
Figure 5C:
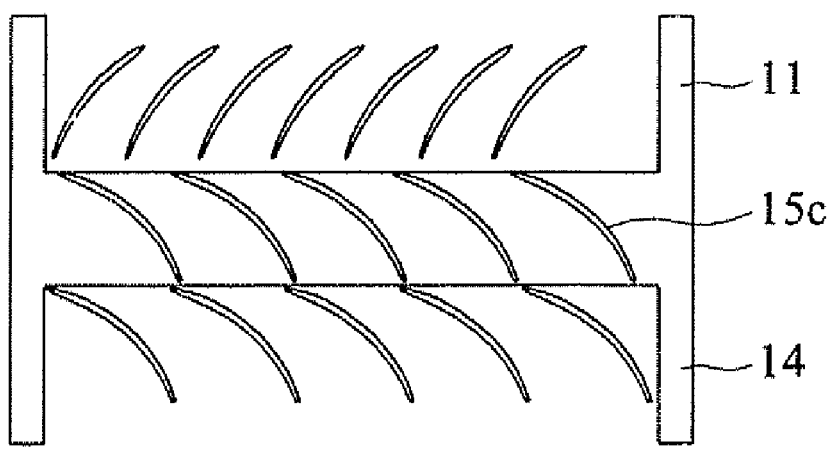

Referring to FIGS. 5A to 5C, the air-guiding blades 15a and 15b can be formed with different configurations. As shown in FIG. 5A, the air-guiding blades 15a and 15b are alternately arranged. Also, as shown in FIG. 5B, each of the air-guiding blades 15a can be formed as a first half of an air-guiding blade, and each of the air-guiding blades 15b can be formed as a second half of the air-guiding blade so that the former and the latter can be combined to construct a complete air-guiding blade. In addition, the air-guiding blades 15a and 15b can be integrally formed together to be air-guiding blades 15c as shown in FIG. 5C. In this case, the air-guiding blades 15c can be integrally formed together with the first frame 11 and the second frame 14.

One can design the shapes of the first blades 122 and the second blades 132 according to the rotation and wind speeds needed so that it does not lower the blast pressure. Since the two rotor vanes 11 and 13 are arranged in series in the frame to minimize the space between the two rotor vanes 11 and 13, the axial-flow serial fan 10 of the invention occupies the least space in the axial direction. This feature is very important for systems such as a server or a notebook that requires a fan having a high flow rate or pressure but has a small space for the fan.

Also, the numbers of the air-guiding blades 15a and 15b can be the same or different. In addition, the shapes and tilting angles of the air-guiding blades 15a and 15b can vary.

While the invention has been described by way of several examples and in terms of preferred embodiments, it is to be understood that the invention is not limited to the disclosed embodiment. To the contrary, it is intended to cover various modifications. Therefore, the scope of the appended claims should be accorded the broadest interpretation so as to encompass all such modifications.

What is claimed is:

1. A serial fan comprising:
    a frame;
    a first rotor vane having a first hub and at least one first blade connected to the first hub;
    a second rotor vane having a second hub and at least one second blade connected to the second hub;
    at least one motor within the first hub or the second hub for driving the first rotor vane and the second rotor vane; and
    a support connected to the frame through a plurality of air-guiding blades capable of increasing the blast pressure of air flow through the serial fan,
    wherein the first rotor vane, the second rotor vane and the plurality of air-guiding blades are arranged in series in the frame along an axial direction, and the plurality of air-guiding blades are disposed therebetween and adjacent to the first rotor vane and the second rotor vane to minimize space occupied by the serial fan in the axial direction and increase the blast pressure of air flow through the serial fan.

2. The serial fan as set forth in claim 1, wherein the plurality of air-guiding blades and the frame are integrally formed together.

3. The serial fan as set forth in claim 1, wherein the first rotor vane and the second rotor vane have the same rotational speed.

4. The serial fan as set forth in claim 1, wherein the first rotor vane and the second rotor vane have different rotational speeds.

5. The serial fan as set forth in claim 1, wherein the first rotor vane and the second rotor vane have the same rotational direction.

6. The serial fan as set forth in claim 1, wherein the first rotor vane and the second rotor vane have different rotational directions.

7. The serial fan as set forth in claim 1, wherein numbers of the first blades and the second blades are the same.

8. The serial fan as set forth in claim 1, wherein numbers of the first blades and the second blades are different.

9. The serial fan as set forth in claim 1, wherein the first blades and the second blades have the same tilting angle.

10. The serial fan as set forth in claim 1, wherein the first blades and the second blades have different tilting angles.

11. A serial fan comprising:
    a frame;
    a first rotor vane having a first hub and at least one first blade connected to the first hub;
    a second rotor vane having a second hub and at least one second blade connected to the second hub;
    a first motor within the first hub for driving the first rotor vane;
    a second motor within the second hub for driving the second rotor vane;
    a first support connected to the frame through a plurality of first connecting parts for receiving the first motor; and
    a second support connected to the frame through a plurality of second connecting parts for receiving the second motor,
    wherein the plurality of first connecting parts are disposed adjacent to the plurality of second connecting parts, the first rotor vane and the second rotor vane are disposed in series in the frame along an axial direction and the plurality of first and second connecting parts are disposed therebetween, and the first rotor vane and the second rotor vane are disposed on opposite sides of the plurality of first and second connecting parts.

12. The serial fan as set forth in claim 11, wherein the plurality of first and second connecting parts are respectively ribs or air-guiding blades.

13. The serial an as set forth in claim 12, wherein the plurality of first and second connecting parts are combined to be form air-guiding blades.

14. The serial fan as set forth in claim 13, wherein the first and second connecting parts and the frame are integrally-formed as a single piece.

15. The serial fan as set forth in claim 11, wherein numbers of the first connecting parts and the second connecting parts are the same or different.

16. The serial fan as set forth in claim 11, wherein the first connecting parts and the second connecting parts are alternately arranged.

17. A serial fan comprising:
    a first frame;
    a second frame;
    a first rotor vane disposed in the first frame and having a first hub and a plurality of blades surrounding the first hub;
    a second rotor vane disposed in the second frame and having a second hub and a plurality of blades surrounding to the second hub;
    a first motor disposed within the first hub for driving the first rotor vane;
    a second motor disposed within the second hub for driving the second rotor vane;
    a first support connected to the first frame through a first set of connecting parts for receiving the first motor; and
    a second support connected to the second frame through a second set of connecting parts for receiving the second motor,
    wherein the first and second sets of connecting parts are alternately arranged and adjacent to each other, and the first and the second rotor vanes are disposed in series along an axial direction and the first and second sets of connecting parts are disposed therebetween.

18. The serial fan as set forth in claim 17, wherein the plurality of first and second sets of connecting parts are respectively ribs or air-guiding blades.

19. The serial fan as set forth in claim 17, wherein the first and second sets of connecting parts and the first and second frames are integrally-formed as a single piece, respectively.

* * * * *